United States Patent
Prins et al.

(10) Patent No.: US 6,424,152 B1
(45) Date of Patent: Jul. 23, 2002

(54) METHOD TO REDUCE ARTEFACTS IN THE MAGNETIC RESONANCE IMAGE DUE TO SPURIOUS MAGNETIC SIGNALS

(75) Inventors: Willem M. Prins; Gerardus N. Peeren, both of Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/486,993

(22) PCT Filed: Jun. 29, 1999

(86) PCT No.: PCT/IB99/01215

§ 371 (c)(1),
(2), (4) Date: Mar. 1, 2000

(87) PCT Pub. No.: WO00/02059

PCT Pub. Date: Jan. 13, 2000

(30) Foreign Application Priority Data

Jul. 2, 1998 (EP) .............................................. 98202211

(51) Int. Cl.$^7$ ................................................. G01V 3/00
(52) U.S. Cl. ........................................ 324/307; 324/309
(58) Field of Search ................................ 324/307, 309, 324/306, 312, 314, 318

(56) References Cited

U.S. PATENT DOCUMENTS

| | | | | |
|---|---|---|---|---|
| 4,766,381 A | * | 8/1988 | Conturo et al. | 324/309 |
| 4,918,386 A | * | 4/1990 | Dumoulin et al. | 324/309 |
| 5,245,283 A | * | 9/1993 | Provost et al. | 324/309 |
| 5,722,409 A | * | 3/1998 | Kuhara et al. | 600/410 |
| 5,833,609 A | * | 11/1998 | Dannels et al. | 600/410 |
| 6,150,815 A | * | 11/2000 | Janzen et al. | 324/309 |
| 6,160,397 A | * | 12/2000 | Washburn et al. | 324/309 |

OTHER PUBLICATIONS

Cho, Z.H., et al., "Total inhomogeneity correction including chemical shifts and susceptibility by view angle tilting," Medical Physics, vol. 15, No. 1, Jan./Feb. 1988, pp. 7–11.*
Haitao Hu and A. J. Shaka "Composite Pulsed Field Gradients with Refocused Chemical Shifts and Short Recovery Time" Journal of Magnetic Resonance vol. 136 pp. 54–62 1999.*

* cited by examiner

Primary Examiner—Edward Lefkowitz
Assistant Examiner—Tiffany A. Fetzner
(74) Attorney, Agent, or Firm—John Vodopia

(57) ABSTRACT

A magnetic resonance imaging facilitates a pre-compensating phase encoding of spuriously generated magnetizations. The method includes generating a preparatory excitation of spins represented upon an RF-excitation line, applying subsequently a temporary magnetic compensation gradient as represented along a phase-encoding axis, generating subsequently an RF excitation pulse as represented upon the RF-excitation line, applying subsequent to the RF excitation pulse, and before an acquisition interval for receiving magnetic resonance signals, a phase-encoding gradient as represented along the phase-encoding axis. The phase-encoding gradient is substantially the same magnitude as, and opposite in direction relative to, the direction of the temporary magnetic compensation gradient. The last step includes receiving magnetic resonance signals during the acquisition interval as represented along the RF-excitation line.

4 Claims, 2 Drawing Sheets

METHOD TO REDUCE ARTEFACTS IN THE MAGNETIC RESONANCE IMAGE DUE TO SPURIOUS MAGNETIC SIGNALS

BACKGROUND OF THE INVENTION

1. Field of the Invention

The invention relates to a magnetic resonance imaging method.

2. Description of Related Art

A magnetic resonance imaging method is disclosed in the European patent application EP 0 526 983.

In order to generate a magnetic resonance image of an object to be examined, the object is placed in a steady, essentially spatially uniform magnetic field. This steady magnetic field to a certain extent aligns magnetic spins in the object in the direction of the magnetic field. In the known magnetic resonance imaging method a 90° RF excitation pulse is applied to excite magnetic spins in a selected part of an object to be examined, such as a patient to be medically examined. The part of the object in which the magnetic spins are excited is selected by way of a temporary selection gradient which is superimposed on the steady magnetic field. A 180° RF refocusing pulse is applied in order to generate magnetic resonance spin echo signals. The magnetic resonance spin echo signals are received by a receiver while a temporary read gradient is superimposed on the steady magnetic field. The read gradient is directed in a read direction. The temporary read gradient frequency-encodes the magnetic resonance spin echo signals in the read direction. Phase-encoding of the magnetic resonance spin echo signals in the phase-encoding direction is carried out by way of phase-encoding gradients superimposed on the steady magnetic field. The phase-encoding direction extends at right angles to the read direction. The phase-encoding gradient and the read gradient effect spatial encoding of the magnetic resonance spin echo signals. The magnetic resonance image is reconstructed from these spatially encoded magnetic resonance spin echo signals.

The known method concerns the avoidance of so-called out-of-slice artefacts in the magnetic resonance image. Such out-of-slice artefacts are mainly caused by imperfections of the 180° RF refocusing pulse. Such imperfections give rise to a spurious transverse magnetisation which leads to disturbing magnetic resonance signals. According to the known method the phase-encoding gradient is applied before the 180° RF refocusing pulse. Consequently, the disturbing magnetic resonance signals due to the imperfections of the 180° RF refocusing pulse are not phase-encoded so that in the magnetic resonance image the out-of-slice artefacts are collapsed into a single column or row of the magnetic resonance image. Although the known method is quite effective in avoiding the out-of-phase artefacts, the known method appears to be restricted to the reduction of corruptions of the image that are due to imperfections of the 180° RF refocusing pulse.

Furthermore, in the known method a predetermined phase-offset is applied to the 90° RF excitation pulse so that the phase of the excited magnetic spins is offset by the predetermined phase-offset. The receiver also changes the phase of the received magnetic resonance spin echo signal by the predetermined phase-offset. The phase of the 180° RF refocusing pulse is not offset. Consequently, the receiver offsets the phase of the spurious magnetic resonance signals due to imperfections of the 180° RF refocusing pulse by the predetermined phase-offset. The predetermined phase-offset of the magnetic resonance spin echo signals due to the 90° RF excitation is cancelled by the predetermined phase-offset of the receiver. Hence, the artefact that is collapsed into a single line is shifted to an edge of the image where it is the least annoying.

Citation of a reference herein, or throughout this specification, is not to construed as an admission that such reference is prior art to the Applicant's invention of the invention subsequently claimed.

SUMMARY OF THE INVENTION

An object of the invention is to provide a magnetic resonance imaging method which is substantially insusceptible to disturbances due to spuriously generated magnetisation, such as the so-called 'Eemland-artefact'.

This object is achieved by the magnetic resonance imaging method according to the invention wherein
- a preparatory excitation of spins is applied,
- subsequently a temporary magnetic compensation gradient is applied in a direction which opposes a phase-encoding direction,
  - subsequently an RF excitation pulse is generated,
  - a phase-encoding gradient is applied in the phase-encoding direction, and
- magnetic resonance signals are received during an acquisition interval.

The temporary magnetic compensation gradient causes a pre-compensating phase-encoding of any spuriously excited spins, i.e. spuriously generated magnetization, in the object under examination. Such spuriously excited spins are, for example, generated in the preparatory excitation. The combined effect of the pre-compensating phase-encoding and the phase-encoding that is applied after the RF-excitation is that the spuriously excited spins have no phase-encoding after the phase-encoding gradient. Hence, these spuriously excited spins cannot give rise to phase-encoded magnetic resonance signals. Consequently, these spuriously excited magnetizations are prevented from causing serious image corruptions such as the 'Eemland-artefact'. As the magnetic resonance signals due to such spuriously excited spins are effectively not phase-encoded, these magnetic resonance signals give rise to only small stripes in the magnetic resonance image that is reconstructed from the magnetic resonance signals. The reduction of image corruptions due to spuriously generated magnetization enhances the diagnostic quality of the magnetic resonance image in that small details in the object being imaged are faithfully rendered visible in the magnetic resonance image. According to the invention it is notably avoided that the magnetic resonance image contains spurious details which are not related to the anatomy of the patient being examined. It is to be noted that the magnetic resonance image forms a technical feature which is of assistance to a physician, for example an MRI-radiologist, to reach a diagnosis.

These and other aspects of the invention will be elaborated in more detail on the basis of the following embodiments.

Preferably, a predetermined phase-offset is applied to the RF-excitation pulse and a compensating phase-offset is applied to the receiver so as to shift the small stripes to an edge of the image where the corruption of the image by such small stripes hardly affects the diagnostic quality of the image. As an alternative, the stripe-like artefact may be shifted to the edge of the image during the reconstruction of the image from the magnetic resonance signals. Notably the RF-excitation and the receiver as well as the preparatory excitation involve respective predetermined phases. Thus, there is a definite phase-difference between the magnetic resonance signals due to the RF-excitation and spurious excitations due to the preparatory excitation. The spurious excitations cause a disturbance that according to the invention is not phase-encoded and hence is collapsed into a stripe. Owing to the definite phase-difference in the reconstruction of the image from the magnetic resonance signals the stripe can be shifted to the edge of the image.

The magnetic resonance imaging method of the invention is particularly effective in mitigating artefacts due to the application of so-called REST slabs (Regional Saturation Technique). Such REST slabs are often applied to avoid perturbation due to motion of a portion of the object to be examined. REST involves preparatory excitation and subsequent dephasing of spins in a selected region. Magnetic spins in the selected region are excited by way of a preparatory RF-excitation pulse and a preparatory selection gradient. Such a selected region is notably a region of the object where motion is expected to occur during magnetic resonance imaging. Usually this portion is indicated as a REST slab. Subsequently, the excited magnetic spins are dephased, notably by a dephasing gradient field. Because the magnetic spins in the REST slab are dephased to a large extent, the magnetic spins in the REST slab hardly emit magnetic resonance signals. However, it has been found that in some practical situations the dephasing of the magnetic spins in the portion selected by the preparatory excitation and the preparatory selection gradient, i.e. the magnetic spins in the REST slab, is not complete so that inadvertently magnetic resonance signals are generated from the REST slab. For example, spurious residual in-phase magnetisation may be generated in the REST slab owing to imperfections in the spatial uniformity of the static magnetic field. If no steps are taken, such residual in-phase magnetisation in the REST slab will give rise to the so-called 'Eemland'-artefact.

Another example of a preparatory excitation which, if no steps are taken, may cause artefacts in the magnetic resonance image is the so-called SPIR pre-pulse (SPectral Inversion Recovery) in which, for example, spins and fat or water are selectively excited. Furthermore, the preparatory excitation may be an MTC (Magnetization Transfer Contrast) pre-pulse.

Preferably, the time-integral of the gradient fields in the phase-encoding direction over the interval from the end of the preparatory excitation until a point in time within the acquisition interval equals a predetermined net gradient. The predetermined net gradient has the same value for all phase-encoding steps; in other words, in the (reciprocal) k-space the predetermined net gradient is independent of $k_y$, where $k_y$ is the component of the wave vector corresponding to the phase-encoding direction. For example, the predetermined net gradient equals zero. The sequence starting with the preparatory sequence until the acquisition of the magnetic resonance signals is usually repeated. In practice such a repetition is carried out very often in order to acquire enough magnetic resonance signals for the reconstruction of the magnetic resonance image with a high diagnostic quality. For example, the sequence is repeated 128 or 256 times and the magnetic resonance signal is sampled for 128 or 256 (frequency) samples in the read direction. Owing to said time-integral of the gradients in the phase-encoding direction, being the same in all repetitions of the sequence, the spuriously generated magnetisation remains not phase-encoded over the repetitions of the sequence. Hence, according to the invention the artefacts which are due to spuriously generated magnetizations and are reduced to stripes can be moved to the edge of the image by the same phase-shift for all repetitions of the sequence. Reduction of the artefacts into small stripes at the edge of the magnetic resonance image is thus simply achieved.

The invention also relates to a magnetic resonance imaging system. The magnetic resonance imaging system according to the invention is arranged to apply a preparatory excitation of spins, to apply subsequently a temporary magnetic compensation gradient in a direction which opposes a phase-encoding direction, to generate subsequently an RF excitation pulse, to apply a phase-encoding gradient, and to receive magnetic resonance signals during an acquisition interval. This system is capable of performing the magnetic resonance imaging method of the invention which achieves a substantial reduction of artefacts due to spuriously generated magnetization, e.g. due to preparatory excitations.

It is to be noted that the functions of the magnetic resonance imaging system are preferably carried out by a suitably programmed computer.

The invention also relates to a computer program for performing the magnetic resonance imaging method of the invention. The computer program according to the invention includes instructions to apply a preparatory excitation of spins, to apply subsequently a temporary magnetic compensation gradient in a direction which opposes a phase-encoding direction, to generate subsequently an RF excitation pulse, to apply a phase-encoding gradient, and to receive magnetic resonance signals during an acquisition interval. Advantageously, the magnetic resonance imaging system includes a computer into which the computer program according to the invention is loaded.

BRIEF DESCRIPTION OF THE DRAWING

These and other aspects of the invention will be elucidated with reference to the embodiments described hereinafter and with reference to the accompanying drawing; therein.

DETAILED DESCRIPTION OF THE PREFERRED EMBODIMENT

Figure 1:
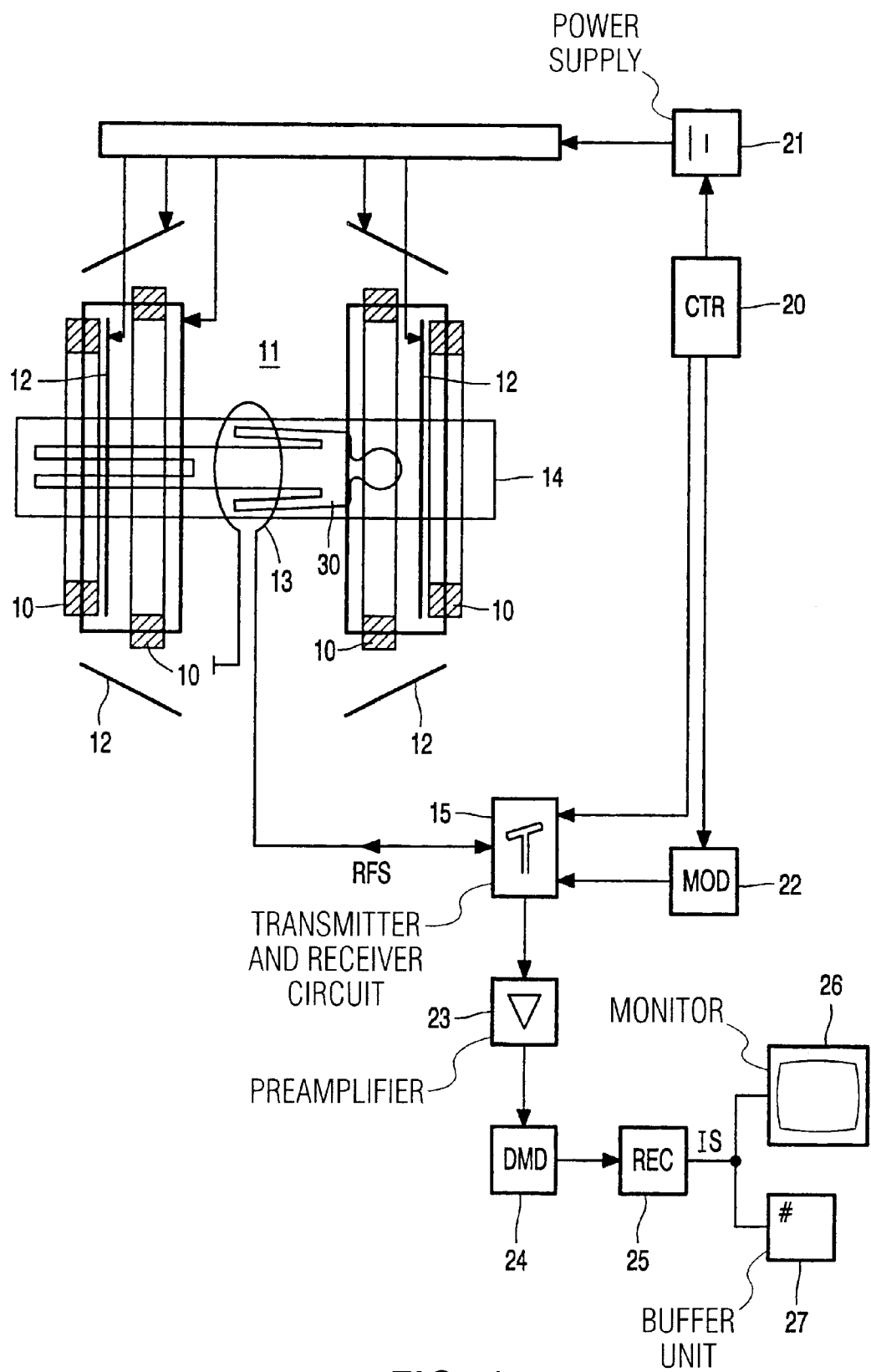
FIG. 1 is a diagrammatic representation of a magnetic resonance imaging system according to the invention.

FIG. 1 is a diagrammatic representation of a magnetic resonance imaging system according to the invention. The magnetic resonance imaging system includes a main magnet 10 which generates a steady magnetic field in an examination space 11 in which a part of the patient 30 to be examined is arranged. The steady magnetic field generated by the main magnet in the examination space is spatially uniform to a large extent. The magnetic resonance imaging system also includes gradient coils 12. The gradient coils 12 generate spatial magnetic field gradients that are superimposed on the steady magnetic field. Furthermore, the magnetic resonance imaging system includes a transmitter coil 13 and a receiver coil 13. The same coil or antenna is often employed alternately as the transmitter coil and the receiver coil. This transmitter and receiver coil 13 is coupled to an electronic transmitter and receiver circuit 15.

The patient 30 to be examined is arranged on a patient table 14 and moved into the bore of the main magnet in such a manner that the part of the body to be examined is situated approximately at the centre of the bore. Using the gradient coils, a selection gradient is applied to select, for example a thin slice in the examination space. Subsequently, the transmitter coil emits an RF electromagnetic excitation pulse whereby the spins in the selected slice in the body of the patient are excited. The excited spins relax to their equilibrium states and emit RF magnetic resonance signals which are received by the receiver coil. The RF magnetic resonance signals are, for example generated as gradient echo signals or as spin echo signals or may also be free-induction decay signals. A reconstruction unit 25 derives an image signal (IS), representing an image of, for example a cross-section of the body of the patient to be examined, from the magnetic resonance signals (RFS).

The gradient coils and the transmitter coil are also used to carry out the preparatory excitation such as the REST pulse.

After the excitation of the spins in the selected slice, the gradient coils 12 apply a phase-encoding gradient field for a predetermined period of time; this phase-encoding gradient field renders the phase of the precession of the magnetization due to the excited spins location-dependent in a phase-encoding direction in the selected slice. Gradient echo signals are generated by way of the read gradient field which is also applied in a read direction after the phase-encoding gradients. The precession frequencies of the excited magnetization in the selected slice are rendered location-dependent in the read direction. Using inter alia Fourier analysis of the magnetic resonance signals, an image, being the magnetic resonance image, of a cross-section in the selected slice of the patient can thus be reconstructed.

The gradient coils 12 are energized by means of a power supply 21 whereto the various gradient coils 12 are coupled. The power supply 21 is controlled by a front-end controller 20. The function of the front-end controller is carried out, for example, by a suitably programmed computer or processor. The front-end controller 20 also tunes the transmitter and receiver circuit 15 Furthermore, the transmitter and receiver circuit 15 is coupled to a modulator 22. The modulator 22 and the transmitter and receiver circuit 15 activate the transmitter coil 13 so as to transmit the desired (RF) excitation pulses. The receiver coil is coupled to a pre-amplifier 23. The pre-amplifier 23 amplifies the magnetic resonance signal (RFS) and the amplified signal is applied to a demodulator 24. The demodulator demodulates the amplified signal. The demodulated signal from the demodulator contains the actual information concerning the local spin densities in the selected slice. Using Fourier transformation and inverse Radon transformation, the reconstruction unit 25 derives the image signal (IS) which represents image information of the selected slice. The image of the selected slice is displayed on a monitor 26; to this end the image signal (IS) is applied to the monitor. The image signal (IS) is also stored in a buffer unit 27 while awaiting further processing or printing as a hard-copy.

Figure 2:
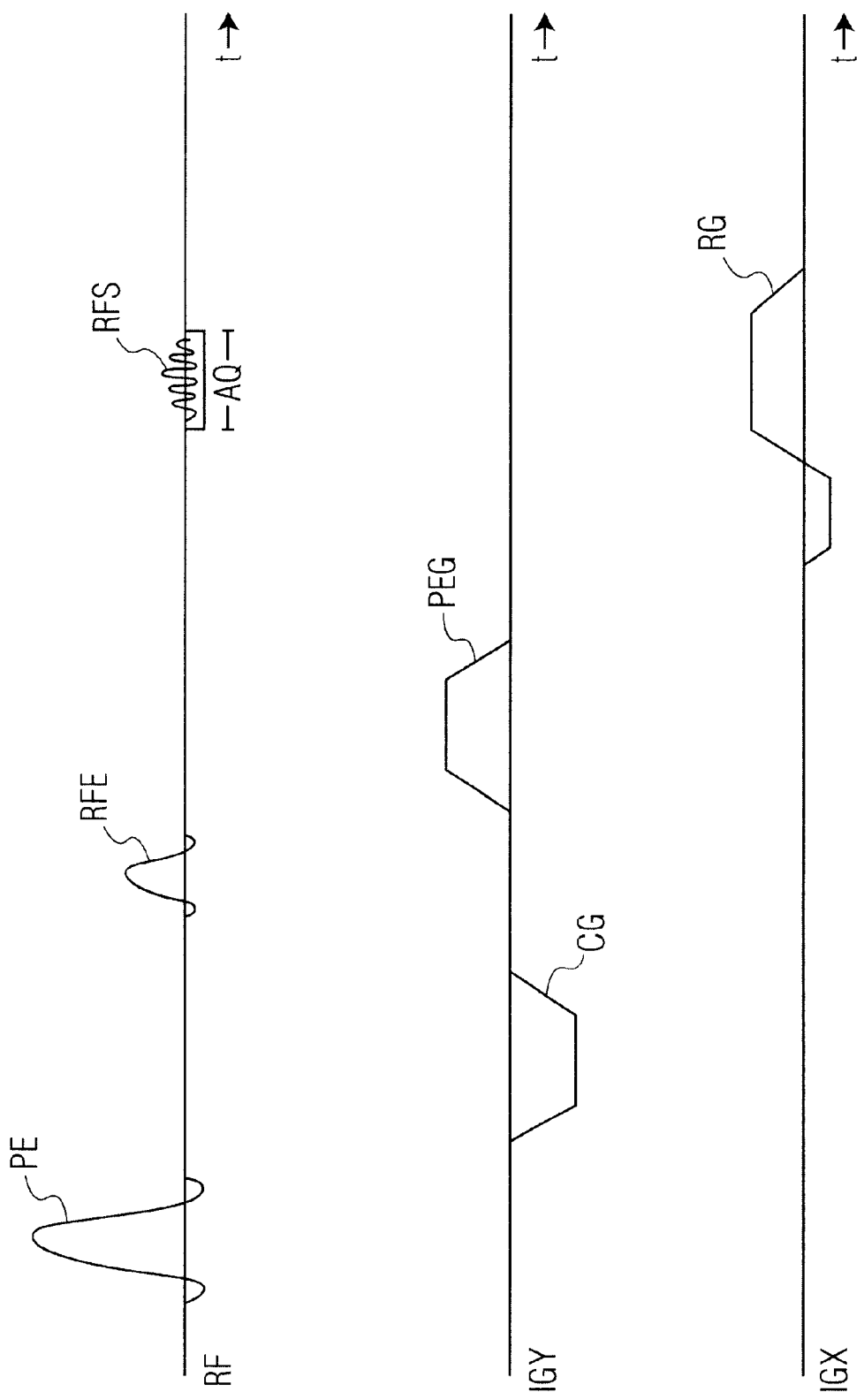
FIG. 2 is a graphic representation of a sequence of excitations and temporary gradients of the magnetic resonance imaging method of the invention.

FIG. 2 is a graphic representation of a sequence of excitations and temporary gradients of the magnetic resonance imaging method of the invention. FIG. 2 schematically indicates the excitation pulses and temporary gradients in various (phase-encode and read) directions on a single time axis. First, there is generated the preparatory excitation PE which is, for example accompanied by dephasing magnetic gradient fields (not shown). The RF excitation RFE is emitted later than the preparatory excitations. After the preparatory pulse PE, and notably before the RF excitation RFE, the compensation magnetic gradient CG is applied in the phase-encoding direction. After the RF excitation RFE a phase-encoding gradient PEG is applied which performs phase-encoding of the magnetization generated by the RF excitation RFE. Due to the combined actions of the compensation gradient CG and the phase-encoding gradient PEG, any inadvertently generated spurious magnetization due to the preparatory excitation will not be phase-encoded. The magnetic resonance signals RFS are acquired during the acquisition interval AQ while the read-gradient RG is being applied. The example shown is a sequence of the FFE-type (Fast Field Echo). Only one gradient echo is shown in FIG. 2, but multiple read-gradients may be successively applied so as to generate multiple gradient echoes. It is to be noted that the invention may also advantageously used for magnetic resonance imaging methods which utilize (multiple) spin-echo sequences The read gradient RG is implemented as a bipolar gradient pair in order to avoid dephasing of the spins due to the read gradient field.

All references cited herein, as well as the priority document European Patent Application 98202211.3 filed Jul. 2, 1998 are incorporated herein by reference in their entirety and for all purposes to the same extent as if each individual publication or patent or patent application was specifically and individually indicated to be incorporated by reference in its entirety for all purposes.

What is claimed is:

1. A magnetic resonance imaging method which facilitates a pre-compensating phase encoding of spuriously generated magnetizations, wherein the method comprises generating a pulse sequence which may be represented as being disposed upon an RF-excitation line, a phase-encoding axis, a slice-encoding axis and a frequency-encoding axis, said method further comprising the steps of:

generating a preparatory excitation of spins represented upon the RF-excitation line, applying subsequently a temporary magnetic compensation gradient as represented along the phase-encoding axis, generating subsequently an RF excitation pulse as represented upon the RF-excitation line, applying subsequent to said RF excitation pulse, and before an acquisition interval for receiving magnetic resonance signals, a phase-encoding gradient as represented along the phase-encoding axis, which phase-encoding gradient is substantially the same magnitude as, and opposite in direction relative to the direction of said temporary magnetic compensation gradient, and receiving magnetic resonance signals during said acquisition interval as represented along the RF-excitation line.

2. The magnetic resonance imaging method as claimed in claim 1, wherein the step of generating a preparatory excitation includes exciting and dephasing spins in a selected region.

3. A magnetic resonance imaging system comprising:

a main field magnet for generating a steady magnetic field an examination zone in which a part of the patient is arranged, gradient coils for generating spatial magnetic field gradients that are superimposed on the steady magnetic field, a radio frequency (RF) transmitter for emitting RF electromagnetic excitation pulses, an RF receiver for receiving RF magnetic resonance signals, and a control unit for controlling the gradient coils, the RF transmitter and the RF receiver, wherein the control unit is arranged to implement a method which facilitates a pre-compensating phase encoding of spuriously generated magnetizations, wherein the method comprises generating a pulse sequence which may be represented as being disposed upon an RF-excitation line, a phase-encoding axis, a slice-encoding axis and a frequency-encoding axis, the method further comprising:

applying a preparatory RF excitation of spins represented upon the RF-excitation line, applying subsequently a temporary magnetic compensation gradient as represented along the phase-encoding axis, generating subsequently an RF excitation pulse as represented along the RF-excitation line, applying subsequent to said RF excitation pulse, and before an acquisition interval of a magnetic resonance signal, a phase-encoding,gradient as represented along the phase-encoding axis, which phase-encoding gradient is of substantially the same magnitude, and opposite in direction relative to the direction of said temporary magnetic compensation gradient, and receiving receive magnetic resonance signals during said acquisition interval as represented along the RF excitation line.

4. A computer program, comprising instructions to implement a method which facilitates a pre-compensating phase encoding of spuriously generated magnetizations, wherein the method comprises generating a pulse sequence which may be represented as being disposed upon an RF-excitation line, a phase-encoding axis, a slice-encoding axis and a frequency-encoding axis, the method further comprising:

applying a preparatory RF excitation of spins represented upon the RF-excitation line, applying subsequently a temporary magnetic compensation gradient as represented along the phase-encoding axis, generating subsequently an RF excitation pulse as represented along the RF-excitation line, applying subsequent to said RF excitation pulse, and before an acquisition interval of magnetic resonance signals, a phase-encoding gradient as represented along the phase-encoding axis, which phase-encoding gradient is substantially the same magnitude, and opposite in direction relative to the direction of said temporary magnetic compensation gradient, and receiving magnetic resonance signals during said acquisition interval as represented along the RF excitation line.

* * * * *